US 12,135,596 B2

United States Patent
Petivan, III et al.

(10) Patent No.: US 12,135,596 B2
(45) Date of Patent: Nov. 5, 2024

(54) FAST BLEED OF POWER RAILS

(71) Applicant: Dell Products L.P., Round Rock, TX (US)

(72) Inventors: James L. Petivan, III, Austin, TX (US); Yun Guo, Round Rock, TX (US); Isaac Q. Wang, Austin, TX (US); Hang Li, Austin, TX (US); Ronald Paul Rudiak, Austin, TX (US); Justin Whittenberg, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 125 days.

(21) Appl. No.: 17/973,943

(22) Filed: Oct. 26, 2022

(65) Prior Publication Data
US 2024/0143057 A1    May 2, 2024

(51) Int. Cl.
| | | |
|---|---|---|
| *G06F 1/30* | (2006.01) | |
| *H02M 1/00* | (2007.01) | |
| *H02M 1/088* | (2006.01) | |
| *H02M 3/155* | (2006.01) | |
| *H02M 3/156* | (2006.01) | |
| *H03K 3/017* | (2006.01) | |

(52) U.S. Cl.
CPC .......... *G06F 1/305* (2013.01); *H02M 1/0032* (2021.05); *H02M 1/0045* (2021.05); *H02M 1/088* (2013.01); *H02M 3/155* (2013.01); *H03K 3/017* (2013.01); *H02M 3/156* (2013.01)

(58) Field of Classification Search
CPC ... G06F 1/305; H02M 1/0032; H02M 1/0045; H02M 1/088; H02M 3/155; H02M 3/156; H03K 3/017
See application file for complete search history.

(56) References Cited

U.S. PATENT DOCUMENTS

| | | |
|---|---|---|
| 10,317,966 B2 | 6/2019 | Johnson et al. |
| 10,594,317 B1* | 3/2020 | Fast, Jr. ............ H03K 17/08122 |
| 2013/0106373 A1* | 5/2013 | Luo ...................... H02M 3/1588 323/271 |
| 2015/0113294 A1* | 4/2015 | Zhang .................... G06F 1/28 713/300 |
| 2018/0262108 A1* | 9/2018 | Luo ...................... H02M 3/1588 |
| 2018/0364784 A1 | 12/2018 | Luo et al. |
| 2020/0266709 A1* | 8/2020 | Simionescu ............ H02M 1/32 |
| 2023/0194577 A1* | 6/2023 | Xue ....................... H02M 1/0009 324/76.11 |

* cited by examiner

*Primary Examiner* — Glenn A. Auve
(74) *Attorney, Agent, or Firm* — Larson Newman, LLP

(57) ABSTRACT

A voltage regulator system of an information handling system includes a Smart Power Stage (SPS) and a voltage regulator controller. The SPS includes a high-side transistor and a low-side transistor. The voltage regulator controller detects a normal power down of the information handling system and sets bleed state for the SPS to a first state. Based on the bleed state being set to the first state, the voltage regulator controller provides a first control voltage to the low-side transistor and a second control voltage to the high-side transistor. The first control voltage causes the low-side transistor to be fully turned on, and the second control voltage causes the high-side transistor to be in a linear region. In response to a predetermined amount of time expiring, the voltage regulator controller enters the SPS in an idle mode.

20 Claims, 4 Drawing Sheets

FAST BLEED OF POWER RAILS

FIELD OF THE DISCLOSURE

This disclosure generally relates to information handling systems, and more particularly relates to fast bleed of power rails.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A voltage regulator system of an information handling system includes a Smart Power Stage (SPS) and a voltage regulator controller. The SPS includes a high-side transistor and a low-side transistor. The voltage regulator controller may detect a normal power down of the information handling system and set bleed state for the SPS to a first state. Based on the bleed state being set to the first state, the voltage regulator controller may provide a first control voltage to the low-side transistor. The first control voltage may cause the low-side transistor to be fully turned on to bleed an output rail. After the output rail is bled to a ground reference voltage, the SPS is set to a second state. Based on the bleed state being set to the second state, the voltage regulator controller may provide the first control voltage to the low-side transistor and a second control voltage to the high-side transistor. The first control voltage may cause the low-side transistor to be fully turned on, and the second control voltage may cause the high-side transistor to be in a linear region or in a pulsed mode to bleed an input rail. In response to a predetermined amount of time expiring or after the input rail voltage reaches a predetermined level, the voltage regulator controller may enter the SPS in an idle mode.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
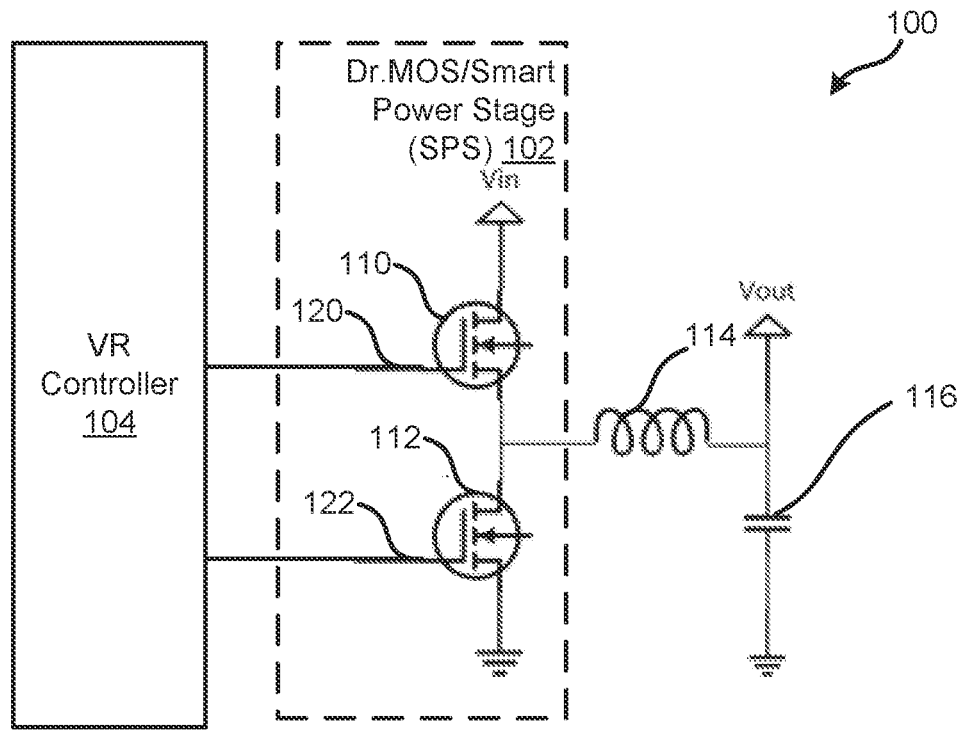
FIGS. 1-3 are schematic diagrams of a voltage regulator system according to an embodiment of the present disclosure.
Figure 2:
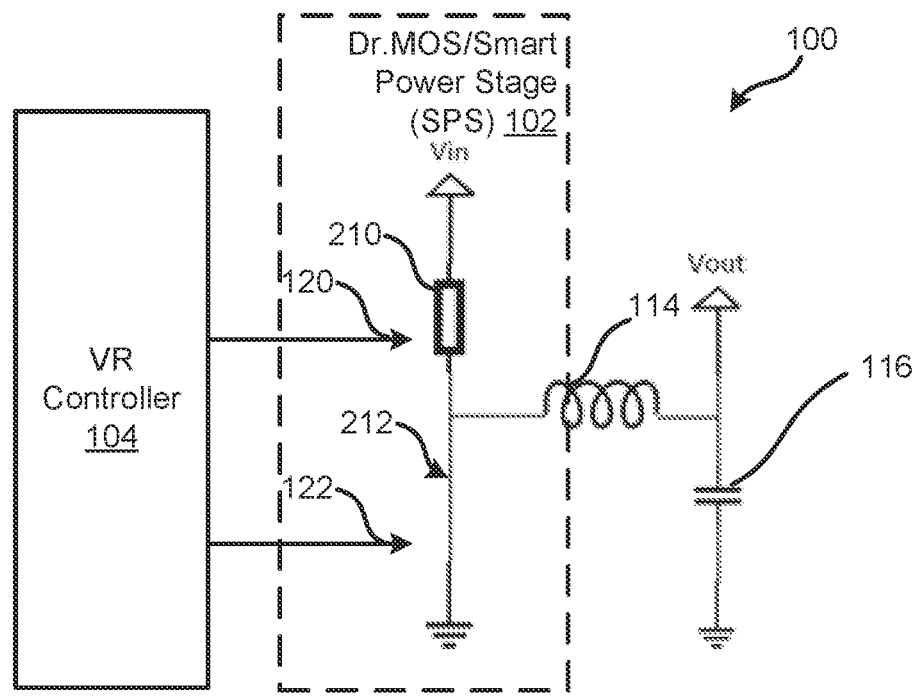
Figure 3:
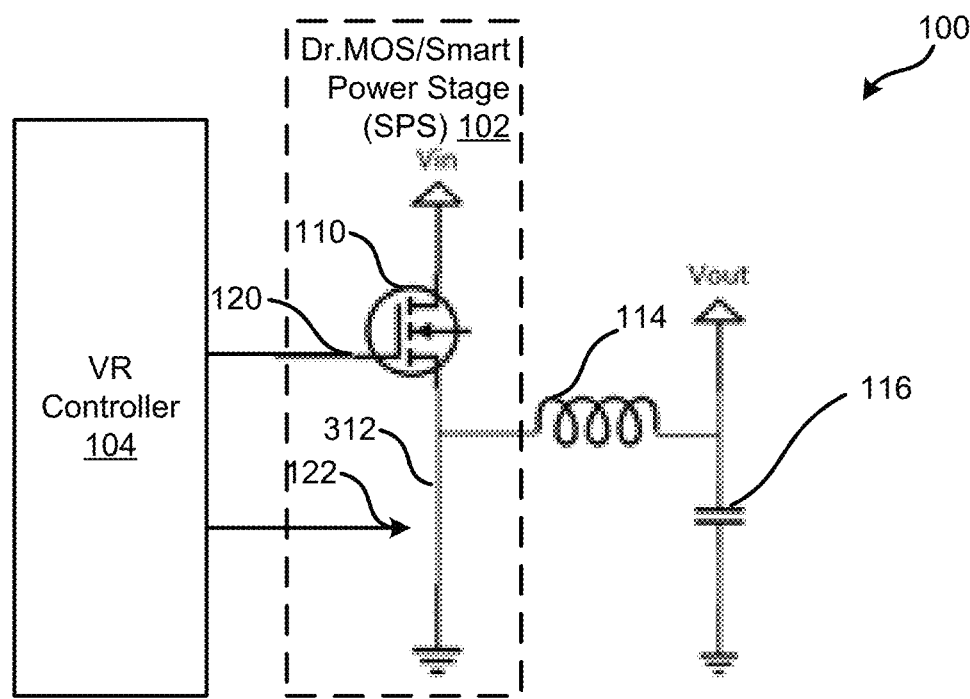

FIGS. 1-3 illustrate a voltage regulator system 100 for an information handling system according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), blade server or rack server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Voltage regulator system 100 includes a Dr.MOS/Smart Power Stage (SPS) 102 and a voltage regulator controller 104. DR.MOS/SPS 102 includes a high-side field effect transistor (FET) 110 and a low-side FET 112. Voltage regulator system 100 further includes an inductor 114 and a capacitor 116. In an example, inductor 114 and capacitor 116 may combine to create an output voltage across the capacitor as is well known in the art. In this example, the output voltage may be provided by the voltage regulator to one or more components of an information handling system, such as components of information handling system 600 of FIG. 6.

During operation of an information handling system, a clean system restart from a power cycle requires that all components within the information handling system reach a fully powered-down state before the attempting to power back up the components. In an example, an amount of time required to drain all power rails of their energy may vary widely depending on the system configuration and loading, such as the number of dual inline memory modules (DIMMs), riser cards, devices attached, or the like. In certain examples, the voltage rails may reduce or bleed down within a specific amount of time, such as seven seconds. In an example, real-world field issues may cause an amount of time to deplete all energy on the voltage rails to be substantially higher, such as almost two minutes, which subsequently resulted in boot failures.

Figure 6:
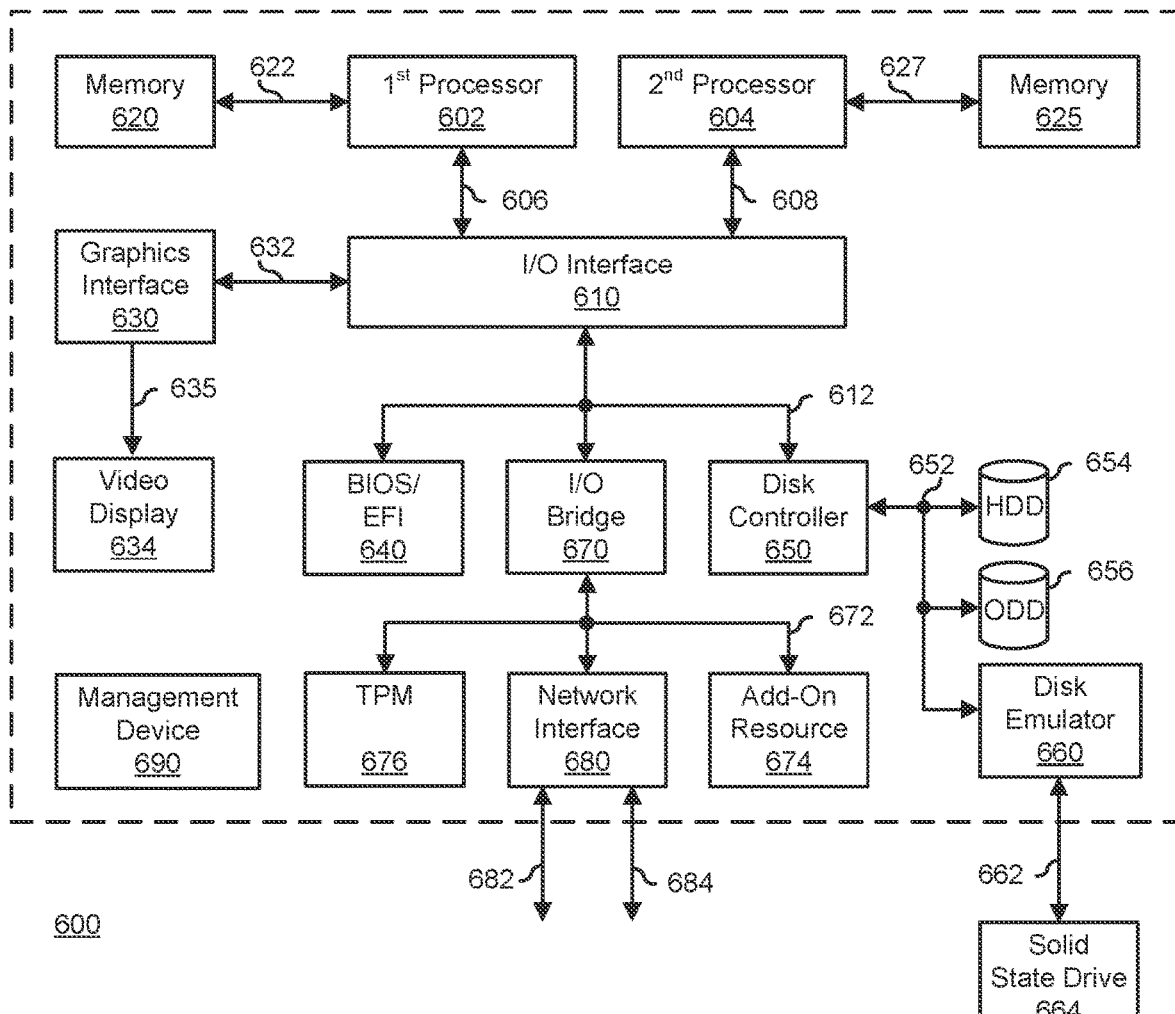
FIG. 6 is a block diagram of a general information handling system according to an embodiment of the present disclosure.

An information handling system, such as information handling system 600 in FIG. 6, and voltage regulator system 100 may be improved by creating a new state specifically for sinking or bleeding energy from the input rail through the large power FETs, such as high-side FET 110 and low-side FET 112. For example, high-side FET 110 and low-side FET 112 may create a managed path to a ground voltage reference (GND) for the input rail (Vin) and the output power rail (Vout). In this example, the low impedance path may create faster bleed times compared to previous regulator systems.

In an example, during a normal power down of an information handling system, such as information handling system 600 in FIG. 6, a host processor may de-assert a voltage regulator enable (EN) signal to voltage regulator controller 104. In response to these signals being de-asserted, voltage regulator 104 may provide one or more signals to Dr.MOS/SPS 102 to enable a fast bleed off of the Vin voltage rail. In certain examples, voltage controller regulator 104 may provide these signals during a shutdown stage when all memory modules and PCIe devices have been already forced into reset and power supply units are ready to be shutdown and to transition into a system idle state.

In certain examples, the fast bleed off of voltage rails Vin and Vout may be performed during different situations of the information handling system and voltage regulator system 100. The fast bleed off may apply to situations like a normal power down, a surprise power down and virtual AC. However, when there may be potential issues with voltage regulator system 100, such as a power fault, voltage regulator controller 104 may not activate an input rail bleed because of the risk of further damage related to the cause of the power fault.

In response to a power fault not being detected, voltage regulator controller 104 may cause voltage regulator system 100 to enter into a first state. During the first state, voltage regulator controller 104 may provide a first signal to low-side FET 112 on control channel 122. In this example, the first signal may cause low-side FET 112 to be turned fully on and perform as a short 212 as shown in FIG. 2. The first control voltage may cause low-side FET 112 to bleed an output rail of Dr.MOS/SPS 102.

In an example, voltage regulator controller 104 may determine whether the output rail, Vout, has been drained to a ground reference voltage. Based on the output rail being drained, voltage regulator controller 104 may activate high-side FET 110 and low-side FET 112 in a new state. For example, after the output rail is bled to a ground reference voltage, the Dr.MOS/SPS 102 is set to a second state. Based on the bleed state being set to the second state, voltage regulator controller 104 provide the first signal to low-side FET 112 on control channel 122 and a second signal to high-side FET 110 on control channel 120. In this example, the first signal may cause low-side FET 112 to be turned fully on and perform as short 212 as shown in FIG. 2. The second control voltage may cause high-side FET 110 to be in a linear region to provide a resistive path 210 for the input rail, Vin, as shown in FIG. 2. In an example, this combination of FET states may hold the output rail low and bleed the input rail with resistive load 210 between the rails via high-side FET 110. In response to a predetermined amount of time expiring or after the input rail voltage reaches a predetermined level, voltage regulator controller 104 may enter Dr.MOS/SPS 102 in an idle mode.

In an example, high-side FET 110 may be managed to hold the high-side FET in a controlled resistive but conductive state 210. For example, resistance 210 may be small enough to allow a fast bleed current but at the same time not too small that a current level may damage components. In certain examples, the second signal may be a pulse width modulated (PWM) signal, which in turn may include a time limit on an amount of time the PWM signal is at a high voltage to prevent overheating or damaging high-side FET 110 and low-side FET 112. In an example, the value of resistance 210 should be high enough so that a voltage divider between the resistance and low-side FET 112 as short 212 may stay in a safe range for output load device of Dr.MOS/SPS 102.

In certain examples, voltage regulator controller 104 may perform one or more operations to control the amount of time the PWM signal is at a high voltage and the amount of time the PWM signal is at a low voltage. For example, voltage regulator controller 104 may monitor a temperature of high-side FET 110 and the current through short 212 via a closed feedback loop. In an example, voltage regulator controller 104 may also measure the temperature of Dr.MOS/SPS 102 across the die containing the MOSFETs. In certain examples, the PWM signal may be held at the high voltage for a fixed amount of time. Then, voltage regulator controller 104 may transition the PWM signal to a low voltage and monitor the temperature of high-side FET 110. In an example, voltage controller 110 may wait for the measured temperature to drop to a reference temperature for high-side FET 110. In response to the measured temperature being at the reference temperature, voltage regulator controller 104 may transition the PWM signal to the high voltage for the next cycle of a fixed amount of time.

In a non-limiting embodiment, the temperature for high-side FET 110 may be 70° C. and activating the high-side FET in the linear mode may cause an increase of 10-20° C. In this embodiment, voltage regulator controller 104 may wait until the temperature of high-side FET 110 is back to the reference temperature of 70° C. before transitioning the PWM signal back to the high voltage level. In an example, the reference voltage should be low enough that when high-side FET 110 is placed in the linear region, the maximum temperature for the high-side FET is not exceeded. In certain examples, as current is pulled through high-side FET 110, the high-side FET may heat up and start pulling more current. In these examples, voltage regulator controller 104 may control the initial amount that high-side FET 110 is activated based on an amount that high-side FET 110 is heated by the current.

In another exemplary implementation, voltage regulator controller 104 may determine whether the output rail, Vout, has been drained. Based on the output rail being drained, voltage regulator controller 104 may activate high-side FET 110 and low-side FET 112 in the new state. For example, voltage regulator controller 104 may provide a first signal to low-side FET 112 on control channel 122 and a second signal to high-side FET 110 on control channel 120. In this example, the first signal may cause low-side FET 112 to be turned fully on and perform as short 312 as shown in FIG.

Figure 4:
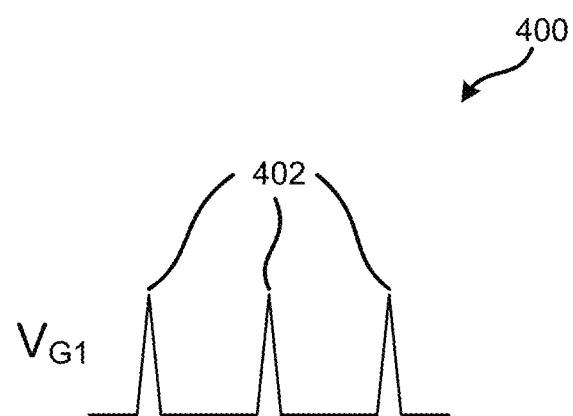
FIG. 4 illustrates a waveform for a voltage regulator according to an embodiment of the present disclosure.

3. The second signal provided to high-side FET 110 may be a sequence of pulses. For example, a waveform 400 may include multiple pulses 402 as shown in FIG. 4. In this example, waveform 400 may be in a low voltage state in between pulses 402.

In certain examples, voltage regulator controller 104 may perform one or more operations to control a length of time for each of pulses 402 and a length of time waveform 400 is at a low voltage. In an example, the length of time waveform 400 is off or at a low voltage may be one or two orders of magnitude longer than the length of time for pulse 402. For example, waveform 400 may be off for a microsecond and pulses 402 may be less than a microsecond. When both high-side FET 110 and low-side FET 112 are on, a short is created between the input rail and GND, which in turn may cause the current flow through the high-side FET and the low-side FET to be very high. If both high-side FET 110 and low-side FET 112 are left on in this state, they would burn up because of the excessive current flow. In an example, the on time for high-side FET 110 may be short enough that the high-side FET and the low-side FET stay in a safe operating range and do not overheat or get damaged. High-side FET 110 may then stay off long enough for the device to cool down, and then the process would repeat.

Figure 5:
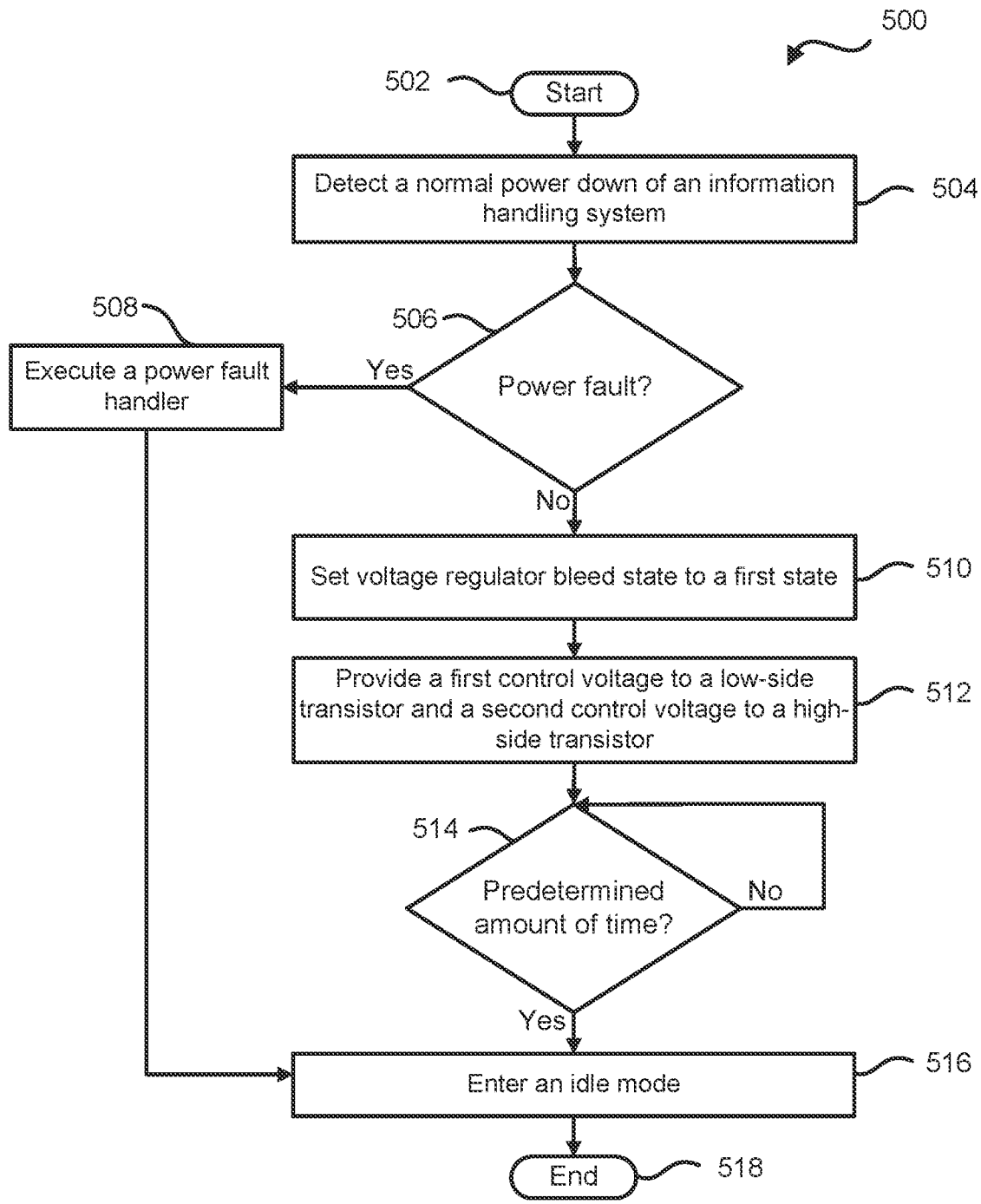
FIG. 5 is a flow diagram of a method for bleeding a main power rail according to an embodiment of the present disclosure.

FIG. 5 illustrates a flow diagram of a method 500 for bleeding a main power rail according to at least one embodiment of the present disclosure, starting at block 502. In an example, the method 500 may be performed by any suitable component including, but not limited to, voltage regulator controller 104 of FIG. 1. Not every method step set forth in this flow diagram is always necessary, and certain steps of the methods may be combined, performed simultaneously, in a different order, or perhaps omitted, without varying from the scope of the disclosure.

At block 504, a normal power down of an information handling system is detected. At block 506, a determination is made whether power fault has been detected. If a power fault has been detected, a power fault handler is executed at block 508, and the flow continues at block 516. If a power fault has not been detected, a Dr.MOS/SPS bleed state is set to a first state at block 510. In an example, the first state may be a digital high state, or a digital low state.

Based on the Dr.MOS/SPS bleed state being set to the first state, a first control voltage to a low-side FET and a second control voltage to a high-side FET are provided at block 512. In an example, the first control voltage provided to the low-side FET may cause the low-side FET to fully activate or turn on, such that the low-side FET performs as a short within the Dr.MOS/SPS. In certain examples, the second control voltage provided to high-side FET may be any suitable signal to cause the high-side FET to be in a linear region of operation. In the linear region, high-side FET may perform or operate as a resistor to limit an amount of current flowing through both the high-side and low-side FETs. In an example, the second control voltage may be a square wave signal, a sequence of short pulses, or the like.

At block 514, a determination is made whether a predetermined amount of time has expired. In an example, the predetermined amount of time may be any suitable amount of time, such as six seconds, seven seconds, eight seconds, or the like. When the predetermined amount of time has expired, the Dr.MOS/SPS is entered into an idle mode at block 516, and the flow ends at block 518.

FIG. 6 shows a generalized embodiment of an information handling system 600 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below and operates to perform one or more of the methods described below. Information handling system 600 includes a processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632 and provides a video display output 636 to a video display 634. In a particular embodiment, information handling system 600 includes separate memories that are dedicated to each of processors 602 and 604 via separate memory interfaces. An example of memories 620 and 630 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 3394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612 or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600.

Management device 690 can operate off of a separate power plane from the components of the host environment so that the management device receives power to manage information handling system 600 when the information handling system is otherwise shut down. An example of management device 690 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A voltage regulator system of an information handling system, the voltage regulator system comprising:
    a Smart Power Stage (SPS) including a high-side transistor and a low-side transistor; and
    a voltage regulator controller to communicate with the high-side and low-side transistors of the SPS, the voltage regulator controller to:
        detect a normal power down of the information handling system;
        set a bleed state for the SPS to a first state;
        based on the bleed state being set to the first state, provide a first control voltage to the low-side transistor and a second control voltage to the high-side transistor,
            wherein the first control voltage causes the low-side transistor to be fully turned on, and the second control voltage causes the high-side transistor to be in a linear region; and
        in response to a predetermined amount of time expiring, enter the SPS in an idle mode.

2. The voltage regulator system of claim 1, wherein prior to the bleed state being set to the first state, the voltage regulator controller further to determine whether a power fault has occurred, and in response to the power fault having occurred, execute a power fault handler, otherwise, set the bleed state to the first state.

3. The voltage regulator system of claim 1, wherein prior to the bleed state being set to the first state, the voltage regulator controller further to determine whether an output rail has been bled to a ground voltage reference during a previous state of the bleed state.

4. The voltage regulator system of claim 1, wherein the second control voltage is a pulse width modulated signal and a duty cycle of the pulse width modulated signal is based on a temperature of the high-side transistor.

5. The voltage regulator system of claim 4, wherein the temperature of the high-side transistor increases while the pulse width modulate signal is in a high state.

6. The voltage regulator system of claim 5, wherein the pulse width modulated signal is in a low state until the temperature of the high-side transistor is substantially equal to a reference temperature.

7. The voltage regulator system of claim 6, wherein the second control voltage is a sequence of pulses, and a first length of time for each pulse in the sequence of pulses is shorter than a second length of time for each period of a low state in between sequential pulses.

8. The voltage regulator system of claim 1, wherein when the low-side transistor is fully turned on and the high-side transistor is in the linear region, a voltage is bled from an input rail of the SPS.

9. A method comprising:
    detecting, by a voltage regulator controller in an information handling system, a normal power down of the information handling system;
    setting, by the voltage regulator controller, a bleed state for a Smart Power Stage (SPS) to a first state;
    based on the bleed state being set to the first state, providing a first control voltage to the low-side transistor and a second control voltage to the high-side transistor, wherein the first control voltage causes the low-side transistor to be fully turned on, and the second control voltage causes the high-side transistor to be in a linear region; and
    in response to a predetermined amount of time expiring, entering the SPS in an idle mode.

10. The method of claim 9, wherein prior to the bleed state being set to the first state, the method further comprises: determining whether a power fault has occurred, and in response to the power fault having occurred, executing a power fault handler, otherwise, setting the bleed state to the first state.

11. The method of claim 9, wherein the second control voltage is a pulse width modulated signal, wherein the method further comprises: controlling a duty cycle of the pulse width modulated signal based on a temperature of the high-side transistor.

12. The method of claim 11, wherein the temperature of the high-side transistor increases while the pulse width modulate signal is in a high state.

13. The method of claim 12, wherein the pulse width modulated signal is in a low state until the temperature of the high-side transistor is substantially equal to a reference temperature.

14. The method of claim 9, wherein the second control voltage is a sequence of pulses.

15. The method of claim 14, wherein a first length of time for each pulse in the sequence of pulses is shorter than a second length of time for each period of a low state in between sequential pulses.

16. The method of claim 9, wherein when the low-side transistor is fully turned on and the high-side transistor is in the linear region, a voltage is bled from an input rail of the SPS.

17. A voltage regulator system of an information handling system, the voltage regulator system comprising:

a Smart Power Stage (SPS) including a high-side transistor and a low-side transistor; and a voltage regulator controller to:
  detect a normal power down of the information handling system;
  if a power fault has occurred, then execute a power fault handler, otherwise set the bleed state for the SPS to a first state;
  if the bleed state is set to the first state, then provide a first control voltage to the low-side transistor and a second control voltage to the high-side transistor,
    wherein the first control voltage causes the low-side transistor to be fully turned on, and the second control voltage causes the high-side transistor to be in a linear region, wherein when the low-side transistor is fully turned on and the high-side transistor is in the linear region, a voltage is bled from an input rail of the SPS; and
  in response to a predetermined amount of time expiring, enter the SPS in an idle mode.

18. The voltage regulator system of claim 17, wherein the second control voltage is a pulse width modulated signal and a duty cycle of the pulse width modulated signal is based on a temperature of the high-side transistor.

19. The voltage regulator system of claim 17, wherein the second control voltage is a sequence of pulses.

20. The voltage regulator system of claim 19, wherein a first length of time for each pulse in the sequence of pulses is shorter than a second length of time for each period of a low state in between sequential pulses.

* * * * *